(12) United States Patent
Ikarashi et al.

(10) Patent No.: US 12,149,217 B2
(45) Date of Patent: Nov. 19, 2024

(54) TRANSMISSION/RECEPTION MODULE

(71) Applicant: Murata Manufacturing Co., Ltd., Kyoto (JP)

(72) Inventors: Kazuhiro Ikarashi, Kyoto (JP); Katsuya Ikegami, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 325 days.

(21) Appl. No.: 17/811,923

(22) Filed: Jul. 12, 2022

(65) Prior Publication Data

US 2023/0018236 A1 Jan. 19, 2023

(30) Foreign Application Priority Data

Jul. 16, 2021 (JP) .................................. 2021-118289

(51) Int. Cl.
  *H03F 3/24* (2006.01)
  *H03F 1/56* (2006.01)
  *H03F 3/195* (2006.01)
  *H03F 3/72* (2006.01)
  *H03H 7/01* (2006.01)
  *H04B 1/40* (2015.01)

(52) U.S. Cl.
  CPC ............ *H03F 3/245* (2013.01); *H03F 1/565* (2013.01); *H04B 1/40* (2013.01); *H03F 2200/222* (2013.01); *H03F 2200/294* (2013.01); *H03F 2200/387* (2013.01); *H03F 2200/451* (2013.01)

(58) Field of Classification Search
  None
  See application file for complete search history.

(56) References Cited

U.S. PATENT DOCUMENTS

| 2015/0028963 | A1 | 1/2015 | Ebihara et al. |
| 2020/0067561 | A1* | 2/2020 | Liu .................... H03F 3/245 |
| 2020/0287584 | A1* | 9/2020 | Yoo .................... H04B 1/0064 |
| 2022/0011868 | A1* | 1/2022 | Junus .................. G06F 3/045 |
| 2022/0158343 | A1* | 5/2022 | Hassan ................ H03F 3/24 |

FOREIGN PATENT DOCUMENTS

| CN | 107809220 | A | * | 3/2018 | ............... H03F 3/19 |
| CN | 105723477 | B | * | 9/2019 | ......... H01F 17/0013 |
| CN | 113595579 | A | * | 11/2021 | |
| JP | 2015-023557 | A | | 2/2015 | |

* cited by examiner

*Primary Examiner* — Mohammed Rachedine

(74) *Attorney, Agent, or Firm* — Pearne & Gordon LLP

(57) ABSTRACT

A transmission/reception module includes a substrate including a transmission signal input terminal, a reception signal output terminal, and an antenna terminal, an antenna switch circuit provided on the substrate and configured to output a transmission signal input from the transmission signal input terminal to the antenna terminal and configured to output a reception signal input from the antenna terminal to the reception signal output terminal, and a first inductor included in an input/output filter circuit provided between the antenna switch circuit and the antenna terminal. The first inductor includes a conductor whose winding axis direction is orthogonal to the substrate.

15 Claims, 18 Drawing Sheets

TRANSMISSION/RECEPTION MODULE

CROSS REFERENCE TO RELATED APPLICATION

This application claims priority from Japanese Patent Application No. 2021-118289 filed on Jul. 16, 2021. The content of this application is incorporated herein by reference in its entirety.

BACKGROUND ART

The present disclosure relates to a transmission/reception module.

In recent years, a transmission/reception module in which a power amplifier circuit, a switch circuit, a control circuit, and the like are integrated has been developed. In such a transmission/reception module, a plurality of functional devices, such as a wafer level chip size package (WL-CSP) and a surface mount device (SMD) are mounted on a low temperature co-fired ceramic (LTCC) substrate or a dielectric substrate. For example, there is disclosed a configuration in which a wider bandwidth and higher speed are achieved by carrier aggregation (CA) in a frequency division duplex (FDD) scheme (for example, Japanese Unexamined Patent Application Publication No. 2015-23557).

In a transmission/reception module that handles a plurality of communication bands, a matching circuit for impedance matching may be provided between circuits. Additionally, an input/output filter circuit may be provided at an antenna output terminal. In such a configuration, magnetic flux coupling occurs between an inductor constituting each matching circuit and an inductor constituting the input/output filter circuit, which may cause deterioration in isolation characteristics and attenuation characteristics of a transmission/reception path.

BRIEF SUMMARY

The present disclosure implements a transmission/reception module capable of suppressing deterioration in isolation characteristics and attenuation characteristics of a transmission/reception path.

A transmission/reception module according to an aspect of the present disclosure includes a substrate including a transmission signal input terminal, a reception signal output terminal, and an antenna terminal, an antenna switch circuit provided on the substrate and configured to output a transmission signal input from the transmission signal input terminal to the antenna terminal and configured to output a reception signal input from the antenna terminal to the reception signal output terminal, and a first inductor included in an input/output filter circuit provided between the antenna switch circuit and the antenna terminal, and the first inductor includes a conductor whose winding axis direction is orthogonal to the substrate.

According to the present disclosure, it is possible to implement a transmission/reception module capable of suppressing deterioration in isolation characteristics and attenuation characteristics of a transmission/reception path.

DETAILED DESCRIPTION

Hereinafter, transmission/reception modules according to embodiments will be described in detail with reference to the drawings. It should be noted that the present disclosure is not limited by the embodiments.

Embodiment 1

Figure 1:
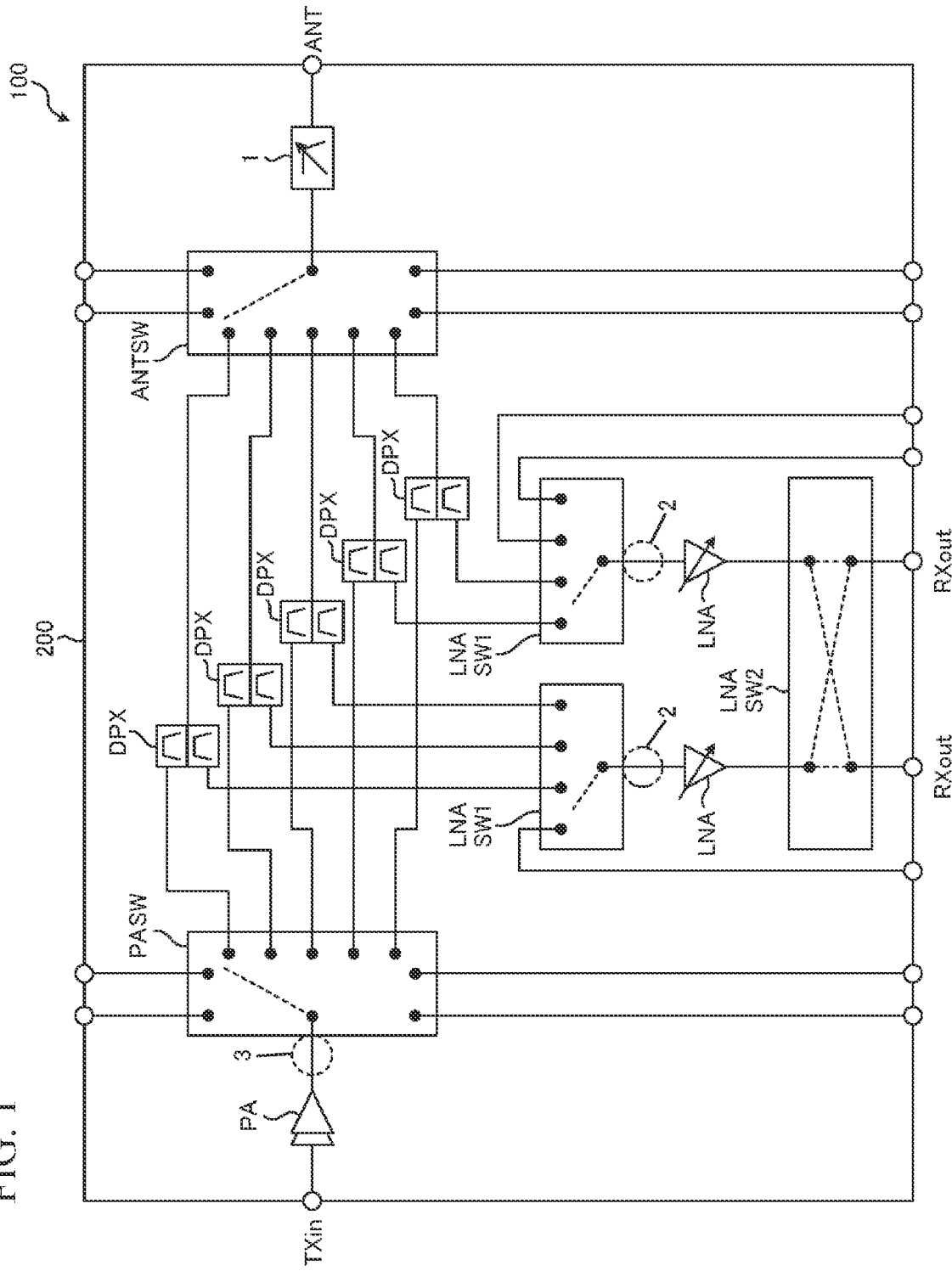
FIG. 1 is a schematic diagram illustrating a configuration example of a transmission/reception module according to Embodiment 1.

FIG. 1 is a schematic diagram illustrating a configuration example of a transmission/reception module according to Embodiment 1.

A transmission/reception module 100 is a microminiature integrated module in which a plurality of integrated circuits mounted on a substrate 200 and various functional components are integrated. Examples of the substrate 200 include a ceramic laminated substrate, such as a low temperature co-fired ceramic (LTCC) substrate, a resin multilayer substrate, and a film substrate.

The transmission/reception module 100 illustrated in FIG. 1 includes a plurality of duplexers DPX for implementing carrier aggregation (CA) for simultaneously transmitting and receiving signals of a plurality of bands in a frequency division duplex (FDD) scheme, E-UTRAN new radio-dual connectivity (EN-DC), or the like, for example. The plurality of duplexers DPX individually has different pass bands.

Different frequencies are assigned to the duplexers DPX for transmission and reception. The duplexer DPX is constituted by a surface mount device (SMD) constituted by, for example, a ceramic-based surface acoustic wave (SAW) filter. Note that each of the duplexers DPX may be constituted by an SMD constituted by a bulk acoustic wave (BAW) filter or an LC filter.

A transmission signal input from a transmission signal input terminal TXin is amplified by a power amplifier circuit PA, appropriately switched by a power amplifier output switch circuit PASW, and input to each duplexer DPX. The transmission signal output from the each duplexer DPX is appropriately switched by an antenna switch circuit ANTSW, and output from an antenna terminal ANT with an input/output filter circuit 1 interposed therebetween. In the present disclosure, an output impedance matching circuit 3 (hereinafter also simply referred to as a "matching circuit 3") is provided at an output side of the power amplifier circuit PA. Specifically, the matching circuit 3 is provided between the transmission signal input terminal TXin and the antenna switch circuit ANTSW. In other words, the matching circuit 3 includes at least one of an impedance element provided in series on a path connecting the transmission signal input terminal TXin and the antenna switch circuit ANTSW and an impedance element provided in series between the path connecting the transmission signal input terminal TXin and the antenna switch circuit ANTSW and a ground. Additionally, an example of the input/output filter circuit 1 is a low pass filter that suppresses high-order harmonic components including a second harmonic component of a transmission signal or a reception signal handled by the transmission/reception module 100, for example. The input/output filter circuit 1 is provided between the antenna switch circuit ANTSW and the antenna terminal ANT. In other words, as will be described later, the input/output filter circuit 1 includes at least one of an impedance element provided in series on a path connecting the antenna switch circuit ANTSW and the antenna terminal ANT and an impedance element provided in series between the path connecting the antenna switch circuit ANTSW and the antenna terminal ANT and the ground.

A reception signal input from the antenna terminal ANT with the input/output filter circuit 1 interposed therebetween is appropriately switched by the antenna switch circuit ANTSW and input to each duplexer DPX. The reception signal output from the each duplexer DPX is appropriately switched by a low noise amplifier input switch LNASW1, input to a low noise amplifier circuit LNA, and output from a reception signal output terminal RXout with a low noise amplifier output switch LNASW2 interposed therebetween. In the present disclosure, an input impedance matching circuit (hereinafter also simply referred to as a "matching circuit 2") is provided at an input side of the low noise amplifier circuit LNA. Specifically, the matching circuit 2 is provided between the reception signal output terminal RXout and the antenna switch circuit ANTSW. In other words, the matching circuit 2 includes at least one of an impedance element provided in series on a path connecting the reception signal output terminal RXout and the antenna switch circuit ANTSW and an impedance element provided in series between the path connecting the reception signal output terminal RXout and the antenna switch circuit ANTSW and the ground.

The power amplifier circuit PA, the low noise amplifier circuit LNA, the power amplifier output switch circuit PASW, the low noise amplifier input switch LNASW1, the low noise amplifier output switch LNASW2, and the antenna switch circuit ANTSW individually include respective functional ICs (not illustrated). Each of these functional ICs is constituted by, for example, a wafer level chip size package (WL-CSP), and is bump-bonded on the substrate 200 of the transmission/reception module 100 by using, for example, copper pillars or the like. Note that two or more circuits among the power amplifier circuit PA, the low noise amplifier circuit LNA, the power amplifier output switch circuit PASW, the low noise amplifier input switch LNASW1, the low noise amplifier output switch LNASW2, and the antenna switch circuit ANTSW may be provided in an identical functional IC.

Figure 2:
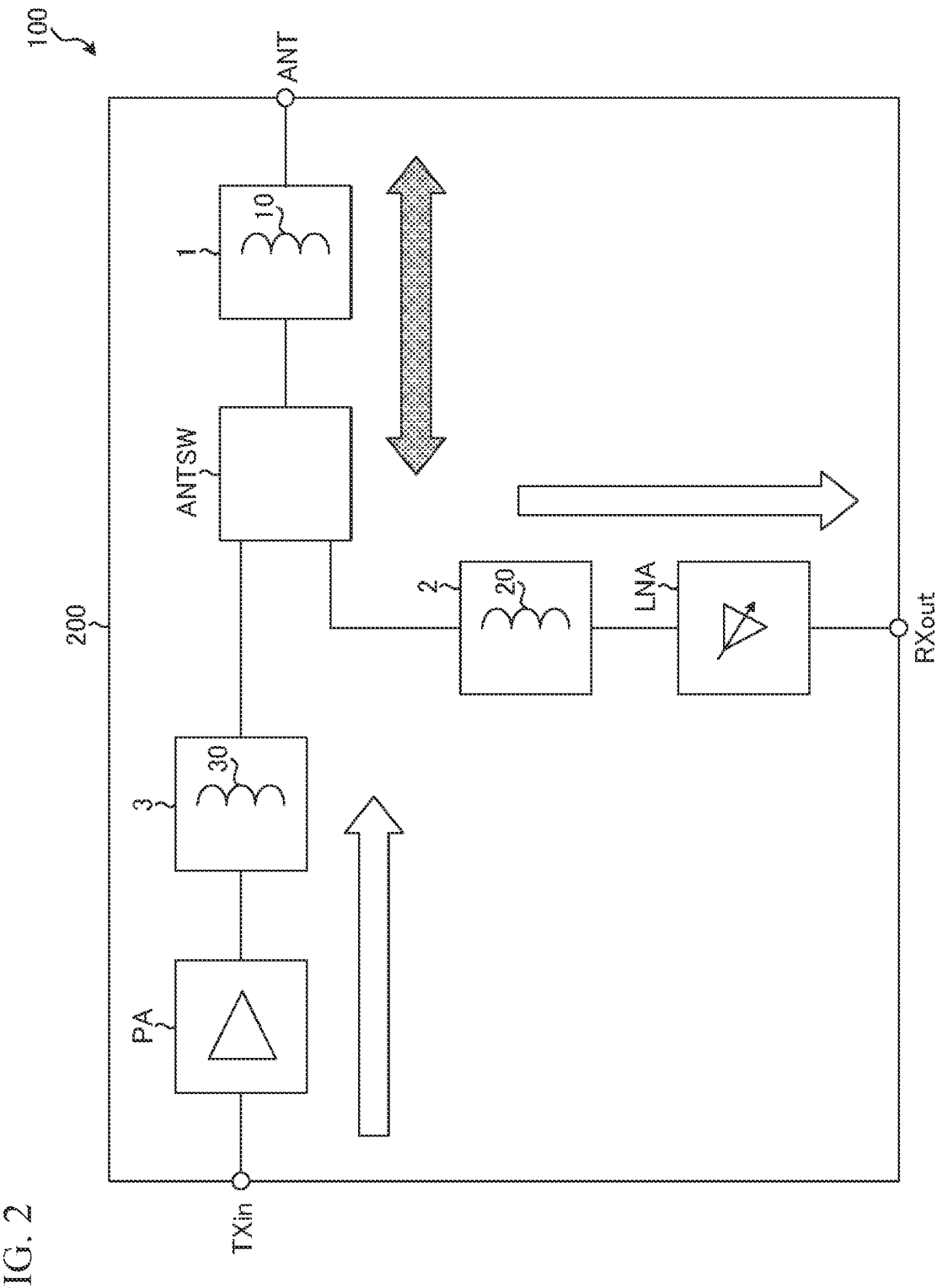
FIG. 2 is a diagram schematically illustrating an input/output filter circuit and matching circuits on a substrate of the transmission/reception module.

FIG. 2 is a diagram schematically illustrating the input/output filter circuit and the respective matching circuits on the substrate of the transmission/reception module. As illustrated in FIG. 2, the input/output filter circuit 1 includes a first inductor 10, the matching circuit 2 includes a second inductor 20, and the matching circuit 3 includes a third inductor 30.

Figure 3:
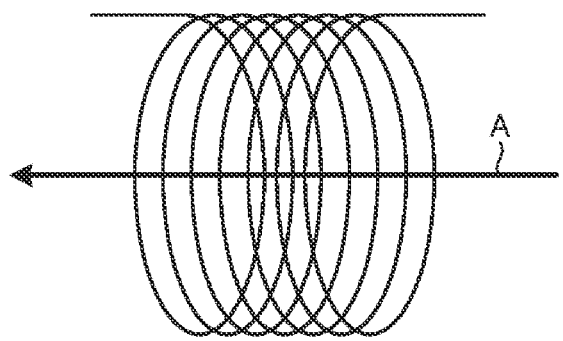
FIG. 3 is a schematic diagram of an inductor.

FIG. 3 is a schematic diagram of an inductor. Each of the first inductor 10 of the input/output filter circuit 1, the second inductor 20 of the matching circuit 2, and the third inductor 30 of the matching circuit 3 has, for example, a wire-wound structure in which a wire is wound around a ceramic core, a film-type structure constituted by a film-shaped conductor, a laminated structure in which coil patterns are laminated, or the like. That is, each of the first inductor 10, the second inductor 20, and the third inductor 30 according to the present disclosure has, for example, a coil-shaped structure in which a conductor is wound as illustrated in FIG. 3. Note that the first inductor 10, the second inductor 20, and the third inductor 30 may have a spiral structure in which a conductor is wound on an identical plane.

When a current flows in such an inductor in which a conductor is wound, as illustrated in FIG. 3, a magnetic flux is generated in a winding axis direction A of the conductor (a direction indicated by an arrow in FIG. 3). When a plurality of inductors is arranged on the substrate 200, a mutual inductance component due to magnetic flux coupling is generated between the inductors, and there is a possibility that attenuation performance of a transmission signal or a reception signal and isolation performance between a transmission signal and a reception signal deteriorate.

In particular, in the configuration of the transmission/reception module 100 according to Embodiment 1 illustrated in FIG. 1, since the first inductor 10 of the input/output filter circuit 1 is provided on a transmission/reception path through which both a transmission signal and a reception signal pass, the first inductor 10 is largely affected by magnetic flux coupling with the second inductor 20 of the matching circuit 2 provided on a transmission path and the third inductor 30 of the matching circuit 3 provided on a reception path. Further, the first inductor 10 of the input/output filter circuit 1 is provided on a transmission/reception path through which both transmission signals of a plurality of bands and reception signals of a plurality of bands pass among transmission/reception paths. Specifically, the first inductor 10 of the input/output filter circuit 1 is provided on a transmission/reception path through which both transmission signals and reception signals of more bands pass compared to a transmission/reception path through which a transmission signal and a reception signal of respective bands pass between each duplexer DPX and the antenna switch circuit ANTSW. Thus, as compared with the transmission/reception path between each duplexer DPX and the antenna switch circuit ANTSW, the influence of the magnetic flux coupling with the second inductor 20 of the matching circuit 2 provided on the transmission path and the third inductor 30 of the matching circuit 3 provided on the reception path is further increased.

For this reason, in the transmission/reception module 100 according to Embodiment 1, the winding axis direction A of the conductor of the first inductor 10 included in the input/output filter circuit 1 is set to a direction orthogonal to the substrate 200. Thus, a generation direction of a magnetic flux of the first inductor 10 that is most likely to be affected by the magnetic flux coupling with other inductors can be set to a direction (the direction orthogonal to the substrate) that is less likely to be affected by the magnetic flux coupling with the other inductors compared to a direction parallel to the substrate, and thus, mutual inductance components generated between the second inductor 20 and the first inductor 10 and between the third inductor 30 and the first inductor 10 can be suppressed.

Figure 4:
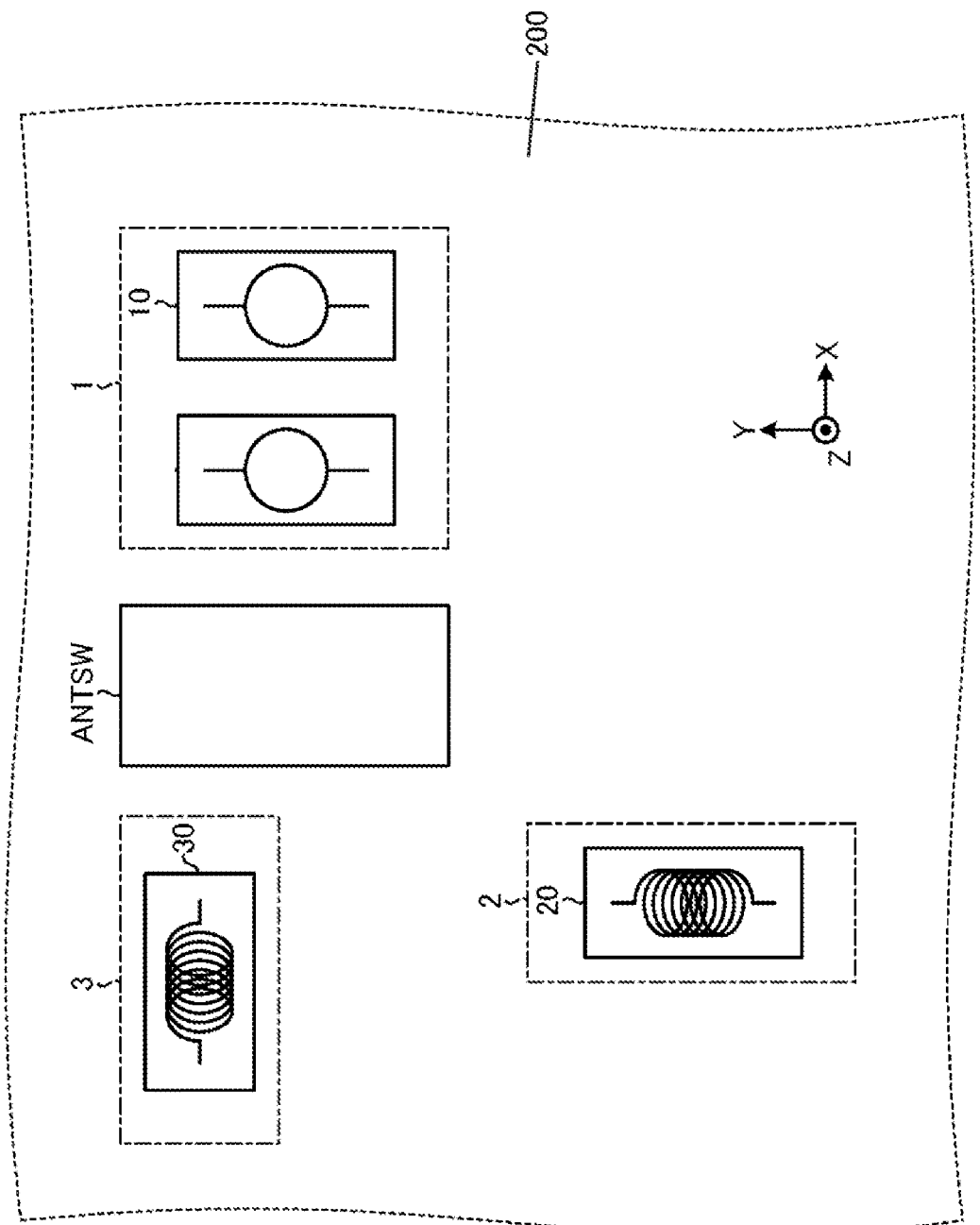
FIG. 4 is a diagram illustrating an example of an arrangement form of a first inductor, a second inductor, and a third inductor on the substrate according to the embodiment.
Figure 5:
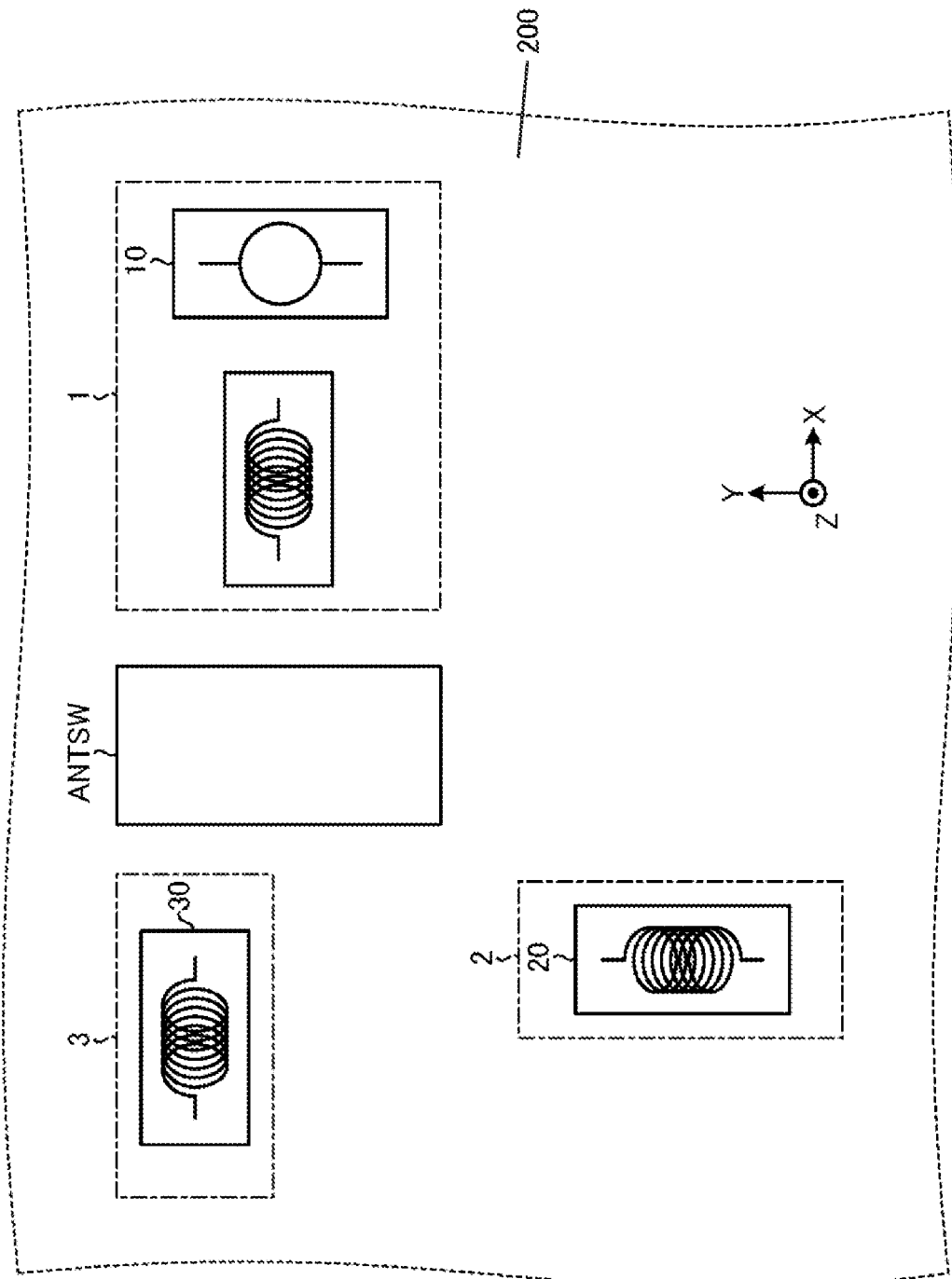
FIG. 5 is a diagram illustrating an example of an arrangement form of a first inductor, a second inductor, and a third inductor on a substrate according to the embodiment.

FIG. 4 is a diagram illustrating a first arrangement form of the first inductor, the second inductor, and the third inductor on the substrate according to Embodiment 1. FIG. 5 is a diagram illustrating a second arrangement form of the first inductor, the second inductor, and the third inductor on the substrate according to Embodiment 1. FIG. 4 and FIG. 5 illustrate examples in which the input/output filter circuit 1 includes a plurality of inductors including the first inductor 10 and another inductor different from the first inductor 10. In the example illustrated in FIG. 4, winding axis directions of all the plurality of inductors (the first inductor 10 and the other inductor) included in the input/output filter circuit 1 are set to the Z-axis direction. In the example illustrated in FIG. 5, a winding axis direction of the other inductor different from the first inductor 10 is set to the X-axis direction.

In the second arrangement form illustrated in FIG. 5, the winding axis direction of the first inductor 10 (the winding axis direction A illustrated in FIG. 3, which will be omitted below) is defined as the Z-axis direction, and the winding axis direction of the other inductor is defined as the X-axis direction. In other words, the winding axis direction of the first inductor 10 included in the input/output filter circuit 1 is set to the direction orthogonal to the substrate 200. In addition, a winding axis direction of the second inductor 20 included in the matching circuit 2 is set to the Y-axis direction, and a winding axis direction of the third inductor 30 included in the matching circuit 3 is set to the X-axis direction. In other words, the winding axis directions of the second inductor 20 included in the matching circuit 2 and the third inductor 30 included in the matching circuit 3 are set to a direction parallel to the substrate 200. Thus, it is possible to suppress mutual inductance components generated between the second inductor 20 whose winding axis direction is set to the Y-axis direction and the first inductor 10, and between the third inductor 30 whose winding axis direction is set to the X-axis direction and the first inductor 10.

Further, in the first arrangement form illustrated in FIG. 4, the winding axis directions of each of the first inductor 10 and the other inductors included in the input/output filter circuit 1 are set to the Z-axis direction. In other words, the winding axis directions of each of the first inductor 10 and the other inductors included in the input/output filter circuit 1 are set to the direction orthogonal to the substrate 200. In addition, the winding axis direction of the second inductor 20 included in the matching circuit 2 is set to the Y-axis direction, and the winding axis direction of the third inductor 30 included in the matching circuit 3 is set to the X-axis direction. In other words, the winding axis directions of the second inductor 20 included in the matching circuit 2 and the third inductor 30 included in the matching circuit 3 are set to the direction parallel to the substrate 200. Thus, as compared with the second arrangement form illustrated in FIG. 5, it is possible to further suppress the mutual inductance components generated between the input/output filter circuit 1 and each of the second inductor 20 whose winding axis direction is the Y-axis direction and the third inductor 30 whose winding axis direction is the X-axis direction.

In the present disclosure, as illustrated in FIG. 4 and FIG. 5, the winding axis direction of the first inductor 10 included in the input/output filter circuit 1 is set to the direction orthogonal to the substrate 200, and the winding axis directions of the second inductor 20 included in the matching circuit 2 and the third inductor 30 included in the matching circuit 3 are set to the direction parallel to the substrate 200. As a result, it is possible to effectively suppress deterioration in attenuation performance of a transmission signal or a reception signal and deterioration in isolation performance between a transmission signal and a reception signal.

Hereinafter, arrangement forms of the second inductor 20 and the third inductor 30 on the substrate 200 will be described with reference to FIG. 6 and FIG. 7.

Figure 6:
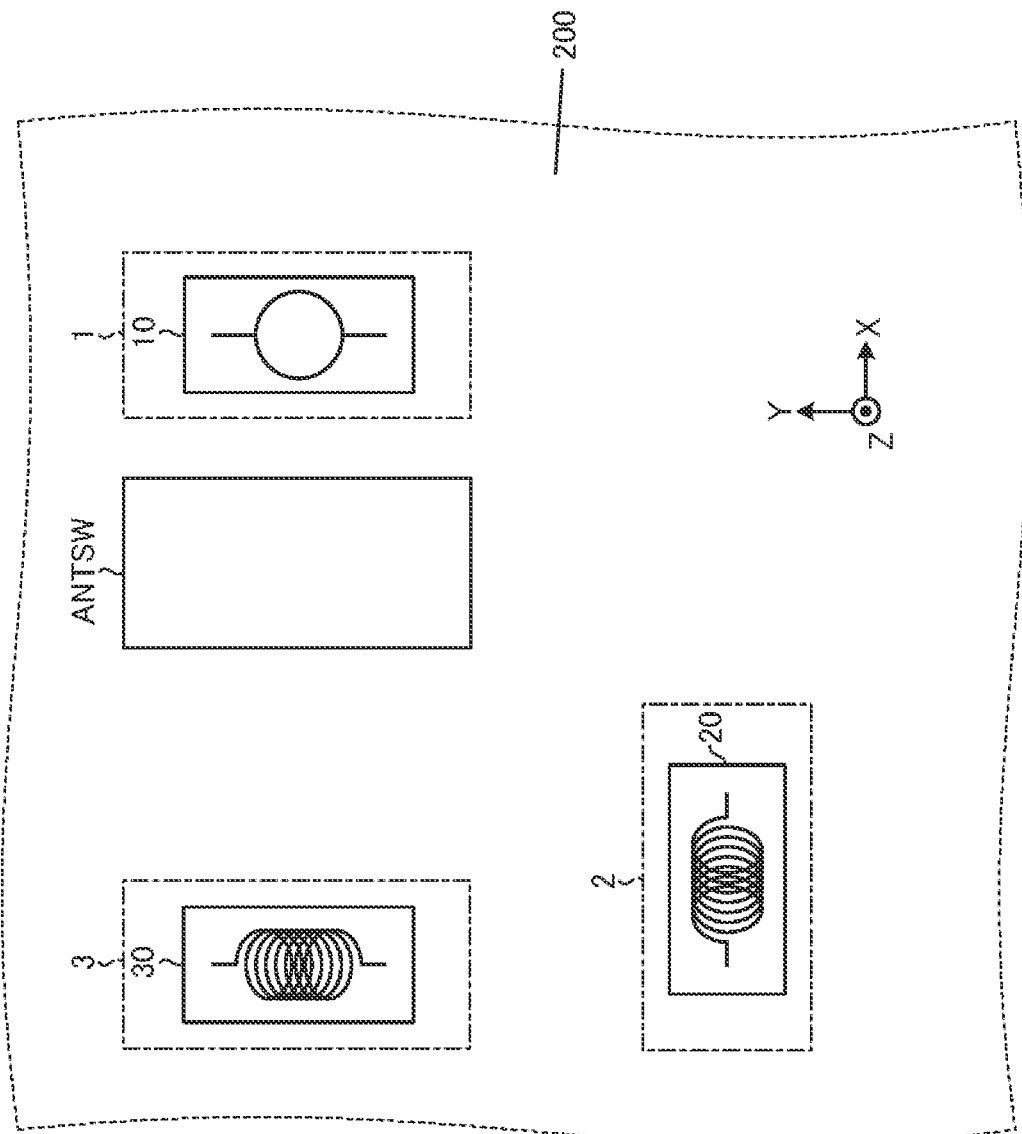
FIG. 6 is a diagram illustrating a first example of an arrangement form of the second inductor and the third inductor on the substrate.

FIG. 6 is a diagram illustrating a first example of an arrangement form of the second inductor and the third inductor on the substrate. In the arrangement form illustrated in FIG. 6, the winding axis direction of the second inductor 20 is set to the X-axis direction, and the winding axis direction of the third inductor 30 is set to the Y-axis direction.

Figure 7:
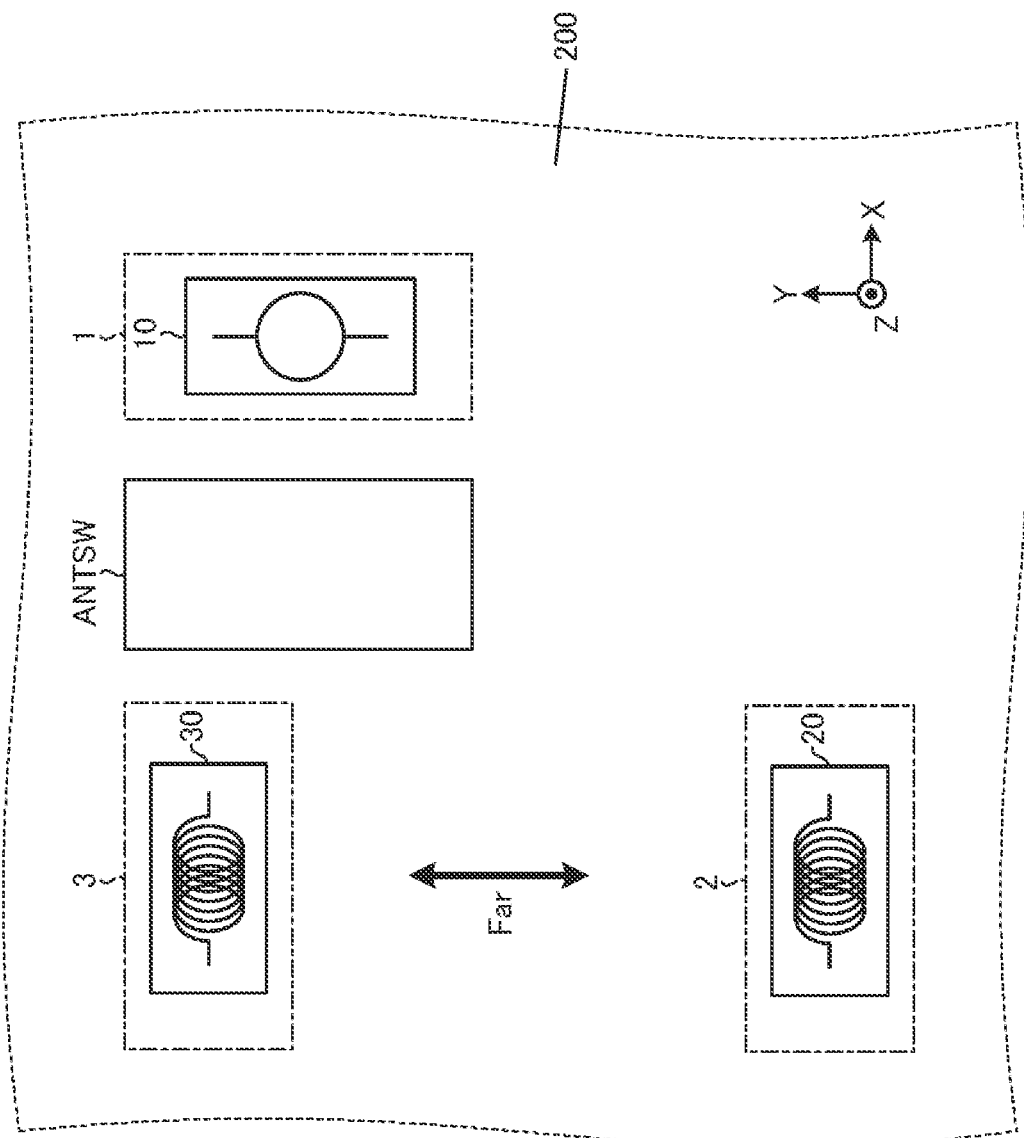
FIG. 7 is a diagram illustrating a second example of an arrangement form of the second inductor and the third inductor on the substrate.

FIG. 7 is a diagram illustrating a second example of an arrangement form of the second inductor and the third inductor on the substrate. In the arrangement form illustrated in FIG. 7, the second inductor 20 and the third inductor 30 are arranged apart from each other on the substrate 200. As described above, when the second inductor 20 and the third inductor 30 are disposed apart from each other on the substrate 200, winding axis directions of the second inductor 20 and the third inductor 30 may substantially coincide with each other. For example, in FIG. 7, a distance between the second inductor 20 and the third inductor 30 is larger than at least one of a distance between the second inductor 20 and the first inductor 10 and a distance between the third inductor 30 and the first inductor 10. Specifically, in the arrangement form illustrated in FIG. 7, the winding axis directions of the second inductor 20 and the third inductor 30 are set to the X-axis direction.

As illustrated in FIG. 6 and FIG. 7, when the winding axis directions of the second inductor 20 included in the matching circuit 2 and the third inductor 30 included in the matching circuit 3 are set to the direction parallel to the substrate 200, and the winding axis direction of the first inductor 10 included in the input/output filter circuit 1 is set to the direction orthogonal to the substrate 200, deterioration in attenuation performance of a transmission signal or a reception signal and deterioration in isolation performance between a transmission signal and a reception signal can be effectively suppressed.

Note that in the present disclosure, the winding axis directions of the second inductor 20 and the third inductor 30 are not limited to the examples illustrated in FIG. 6 and FIG. 7. For example, depending on the arrangement of the matching circuit 2 and the matching circuit 3 on the substrate 200, the winding axis directions of the second inductor 20 and the third inductor 30 may be set to the Y-axis direction, and the winding axis directions of the second inductor 20 and the third inductor 30 do not need to be set to the X-axis direction or the Y-axis direction. Furthermore, the winding axis directions of the second inductor 20 and the third inductor 30 may be set to the Z-axis direction, that is, the direction orthogonal to the substrate 200. Even in this case, by setting the winding axis direction of the first inductor 10 included in the input/output filter circuit 1 to the direction orthogonal to the substrate 200, it is possible to suppress the mutual inductance components generated between the second inductor 20 and the first inductor 10 and between the third inductor 30 and the first inductor 10.

Figure 8:
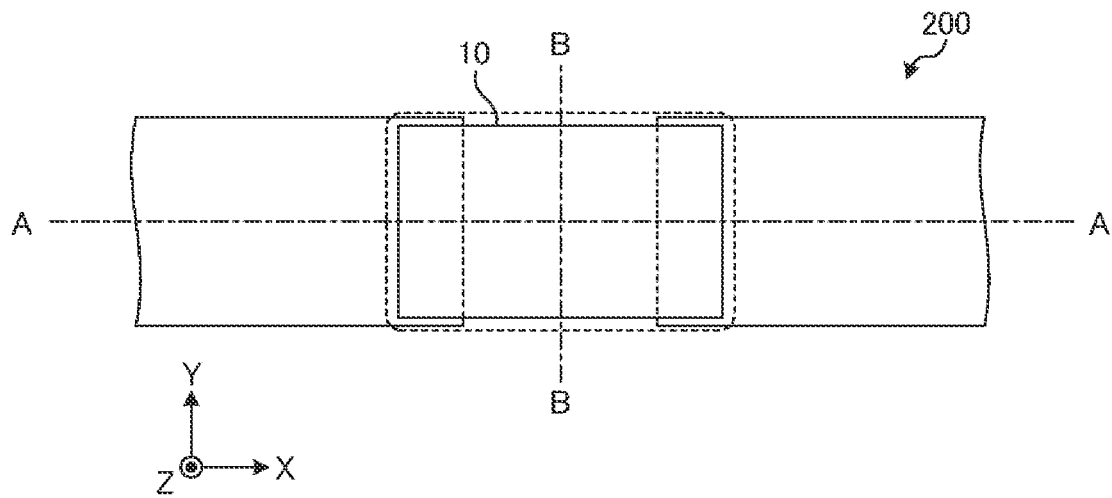
FIG. 8 is a top view illustrating a first example of a substrate layer configuration in a case where the first inductor is constituted by an SMD.
Figure 9:
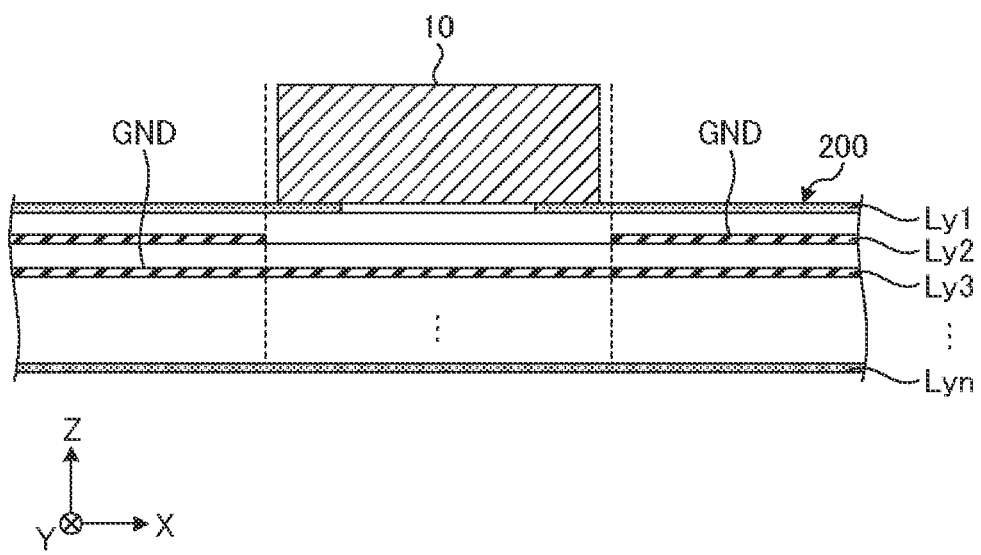
FIG. 9 is a cross-sectional view taken along a line A-A illustrated in FIG. 8.
Figure 10:
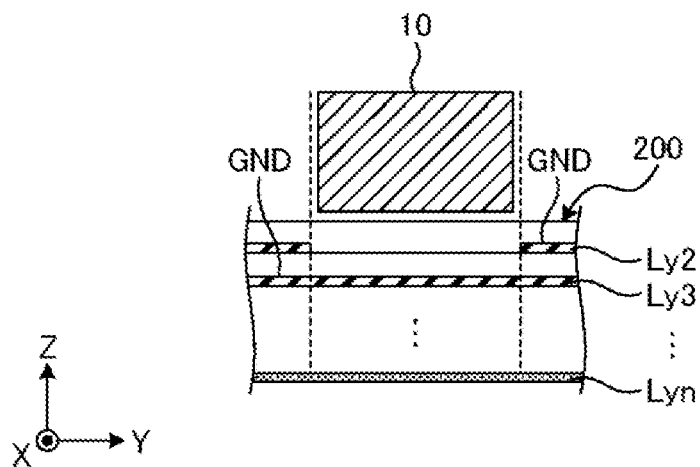
FIG. 10 is a cross-sectional view taken along a line B-B illustrated in FIG. 8.

FIG. 8 is a top view illustrating a first example of a substrate layer configuration in a case where the first inductor is constituted by an SMD. FIG. 9 is a cross-sectional view taken along a line A-A illustrated in FIG. 8. FIG. 10 is a cross-sectional view taken along a line B-B illustrated in FIG. 8.

Figure 11:
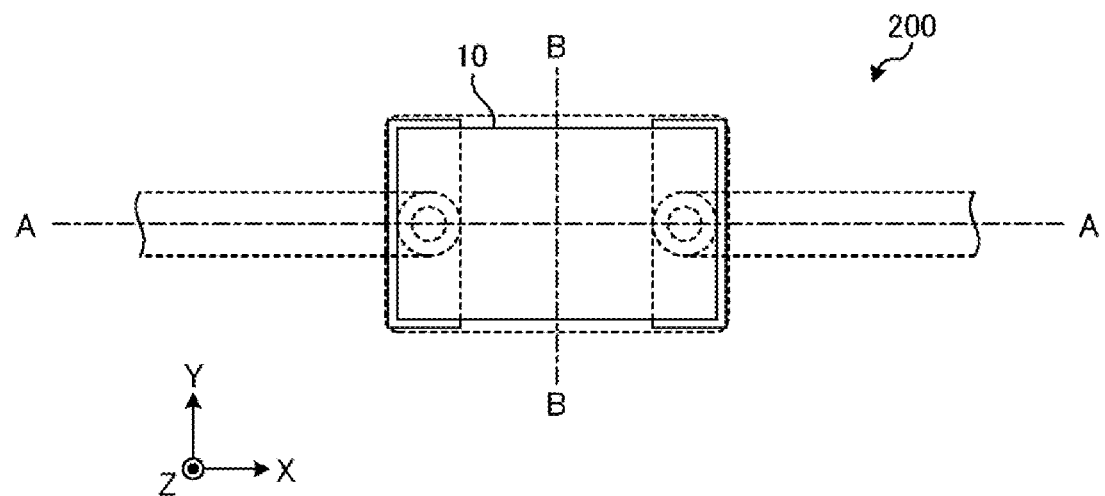
FIG. 11 is a top view illustrating a second example of the substrate layer configuration in the case where the first inductor is constituted by the SMD.
Figure 12:
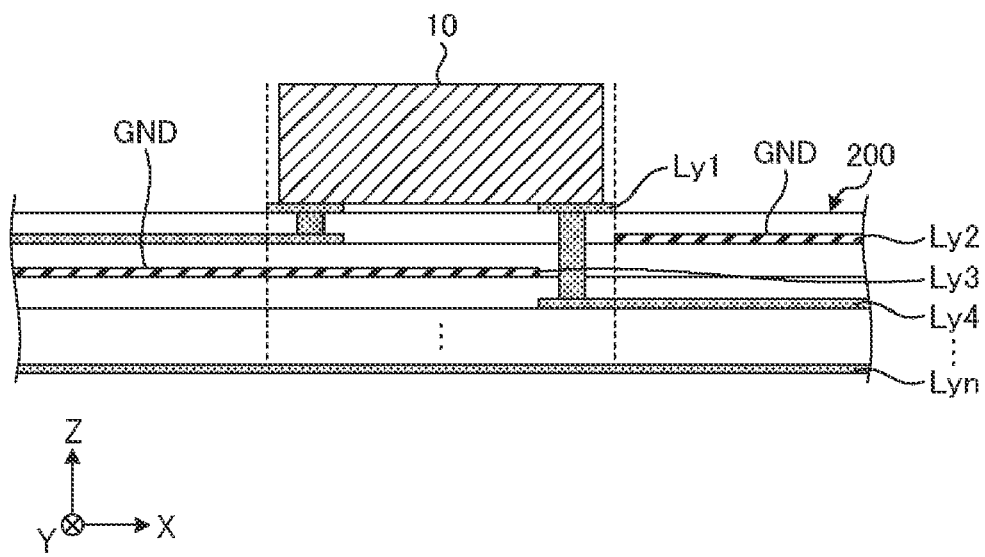
FIG. 12 is a cross-sectional view taken along a line A-A illustrated in FIG. 11.
Figure 13:
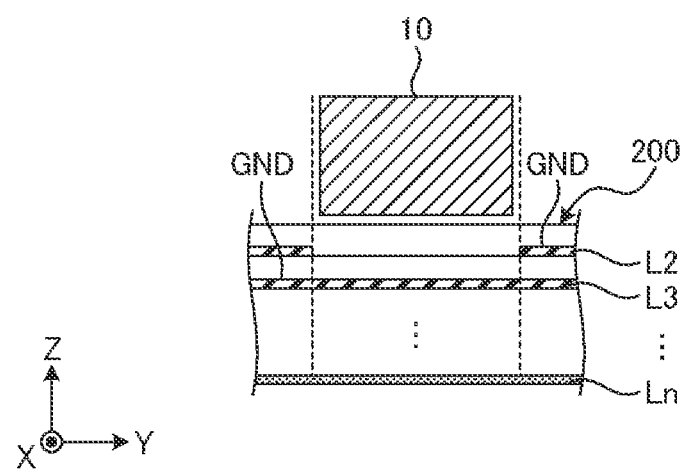
FIG. 13 is a cross-sectional view taken along a line B-B illustrated in FIG. 11.

FIG. 11 is a top view illustrating a second example of a substrate layer configuration in a case where the first inductor is constituted by an SMD. FIG. 12 is a cross-sectional view taken along a line A-A illustrated in FIG. 11. FIG. 13 is a cross-sectional view taken along a line B-B illustrated in FIG. 11.

Figure 14:
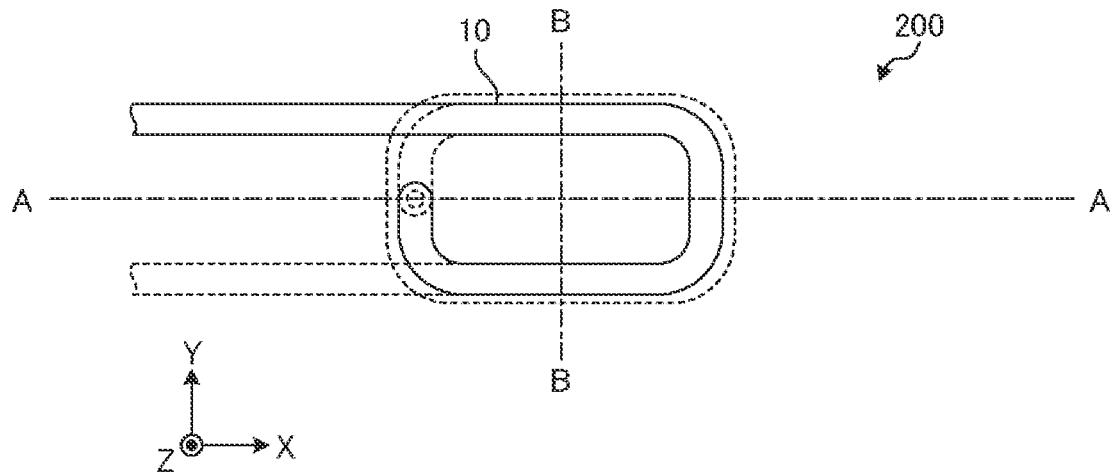
FIG. 14 is a top view illustrating an example of a substrate layer configuration in a case where the first inductor is constituted by a conductor provided on the substrate.
Figure 15:
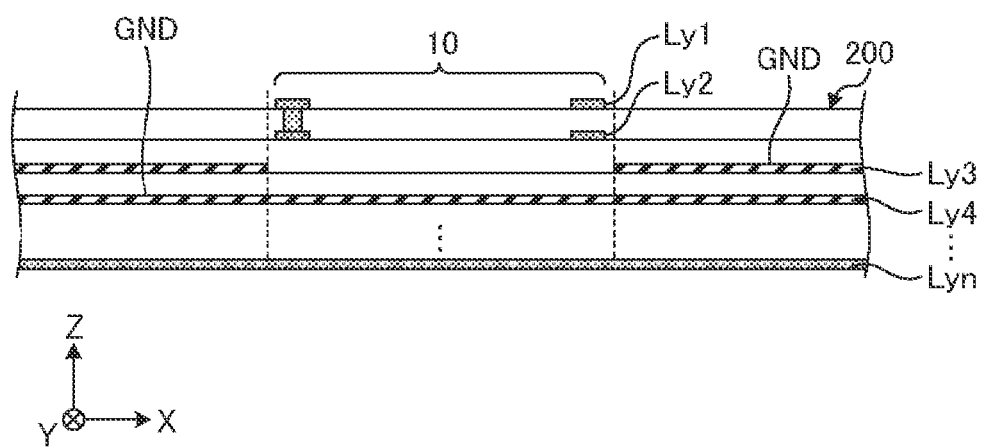
FIG. 15 is a cross-sectional view taken along a line A-A illustrated in FIG. 14.
Figure 16:
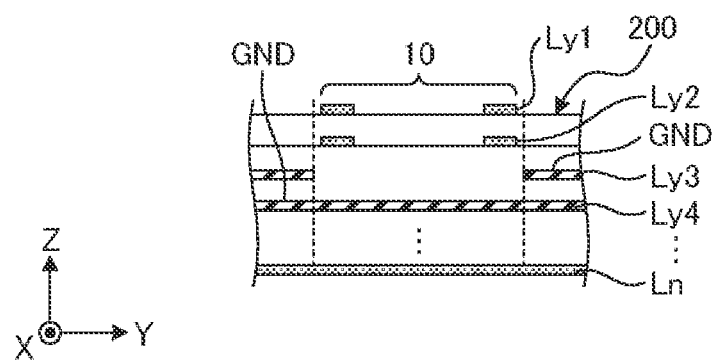
FIG. 16 is a cross-sectional view taken along a line B-B illustrated in FIG. 14.

FIG. 14 is a top view illustrating an example of a substrate layer configuration in a case where the first inductor is constituted by a conductor provided on the substrate. FIG. 15 is a cross-sectional view taken along a line A-A illustrated in FIG. 14. FIG. 16 is a cross-sectional view taken along a line B-B illustrated in FIG. 14.

In the examples illustrated in FIG. 8 to FIG. 16, the substrate 200 is a multilayer substrate in which a plurality of wiring layers Ly1, Ly2, Ly3, . . . , and Lyn (n is a natural number) is laminated with insulator layers interposed therebetween.

As illustrated in FIG. 8 to FIG. 13, when the first inductor 10 is constituted by an SMD, a wiring (GND wiring) connected to a ground potential is not provided in a region that is indicated within broken lines and that overlaps the first inductor 10 of the wiring layer Ly2 adjacent in the lamination direction to the wiring layer Ly1 to which the first inductor 10 is connected in a top view (in a plan view from a mounting surface side of the first inductor 10 of the substrate 200 along the lamination direction of the plurality of wiring layers Ly1, Ly2, Ly3, . . . , Lyn). Note that as illustrated in FIG. 12, in the wiring layer Ly2 adjacent to the wiring layer Ly1 in the lamination direction, a wiring other than the GND wiring (for example, a wiring connected to the input terminal or the output terminals) may be provided.

Additionally, as illustrated in FIG. 14 to FIG. 16, when the first inductor 10 is constituted by a conductor provided on the substrate 200, no GND wiring is provided in a region that is within broken lines and that overlaps the first inductor 10 in the wiring layer Ly3 adjacent in the lamination direction to the wiring layers Ly1 and Ly2 to which the first inductor 10 is connected in a top view.

With such a configuration, a decrease in Q factor of the first inductor 10 can be suppressed.

Figure 17:
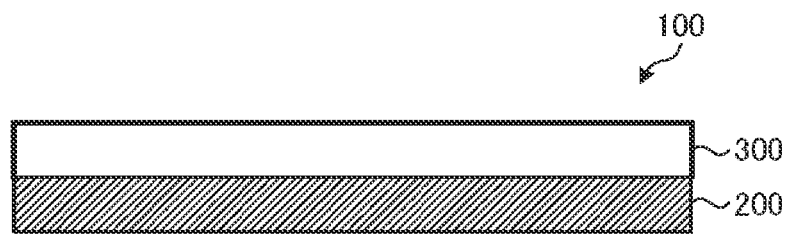
FIG. 17 is a schematic cross-sectional view of the transmission/reception module according to the embodiment.

FIG. 17 is a schematic cross-sectional view of the transmission/reception module according to the embodiment. As illustrated in FIG. 17, a configuration in which a component mounting surface (a surface on which the first inductor 10 is mounted) of the substrate 200 of the transmission/reception module 100 is covered with a shield case 300 is conceivable. Specifically, the shield case 300 is provided over sealing resin that covers the component mounting surface of the substrate 200 and components such as the first inductor 10 mounted on the component mounting surface. With such a configuration, since the magnetic flux of the first inductor 10 formed in the direction orthogonal to the substrate 200 is blocked by the shield case 300, it is possible to enhance the effect of suppressing the mutual inductance components generated between the second inductor 20 or the third inductor 30 whose winding axis direction is set to the direction parallel to the substrate 200 and the first inductor 10 whose winding axis direction is set to the direction orthogonal to the substrate 200. As a result, it is possible to more effectively suppress deterioration in attenuation performance of a transmission signal or a reception signal and deterioration in isolation performance between a transmission signal and a reception signal.

Figure 18:
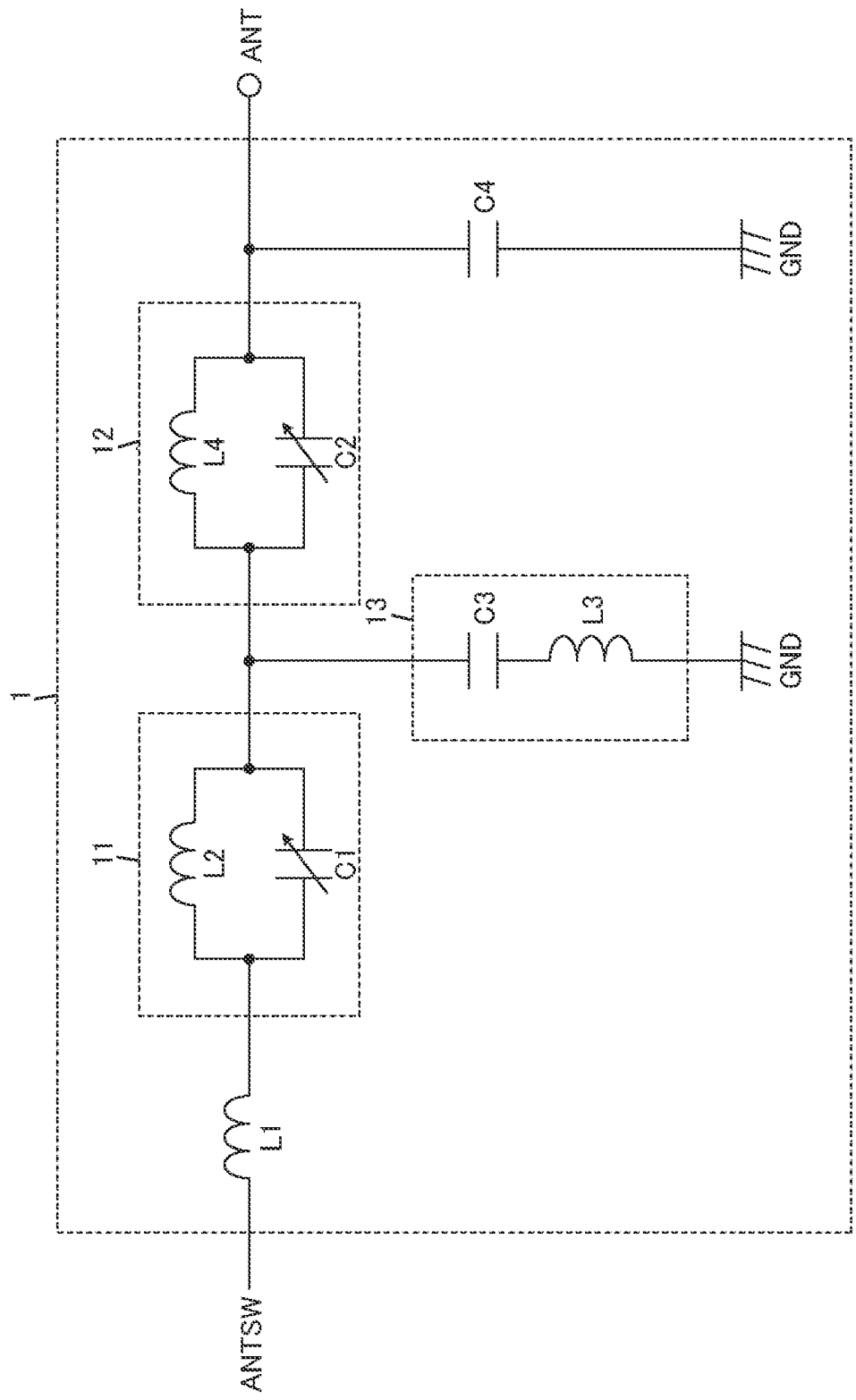
FIG. 18 is a circuit diagram illustrating an example of a configuration of the input/output filter circuit.

FIG. 18 is a circuit diagram illustrating an example of the configuration of the input/output filter circuit. In the example illustrated in FIG. 18, the input/output filter circuit 1 is a low pass filter that suppresses high-order harmonic components including a second harmonic component of a transmission signal or a reception signal handled by the transmission/reception module 100.

The input/output filter circuit 1 illustrated in FIG. 18 includes inductors L1, L2, and L4 connected in series between the antenna switch circuit ANTSW and the antenna terminal ANT, a variable capacitor C1 connected in parallel to the inductor L2, a variable capacitor C2 connected in parallel to the inductor L4, and an inductor L3 and a capacitor C3 provided between a ground potential (GND) and a connection point between the inductor L2 and the inductor L4. The inductor L2 and the capacitor C1 constitute a first parallel resonance circuit 11. The inductor L4 and the capacitor C2 constitute a second parallel resonance circuit 12. The inductor L3 and the capacitor C3 constitute a series resonance circuit 13.

Further, the input/output filter circuit 1 includes a capacitor C4 provided between an output point of the second parallel resonance circuit 12 and a GND.

The inductor L1 corresponds to the first inductor 10. The inductor L1 is a series inductor provided in series on a path connecting the antenna switch circuit ANTSW and the antenna terminal. The inductors L2, L3, and L4 correspond to another inductor. Among the inductors L2, L3, and L4, the inductors L2 and L4 are series inductors provided in series on the path connecting the antenna switch circuit ANTSW and the antenna terminal, and the inductor L3 is a shunt inductor provided in series on a path connecting the path connecting the antenna switch circuit ANTSW and the antenna terminal and the ground. The inductor L3 corresponds to a "fourth inductor" of the present disclosure.

The input/output filter circuit 1 having the configuration illustrated in FIG. 18 is a low pass filter having three resonance points (poles) of respective resonance circuits that are the first parallel resonance circuit 11, the second parallel resonance circuit 12, and the series resonance circuit 13.

Figure 19:
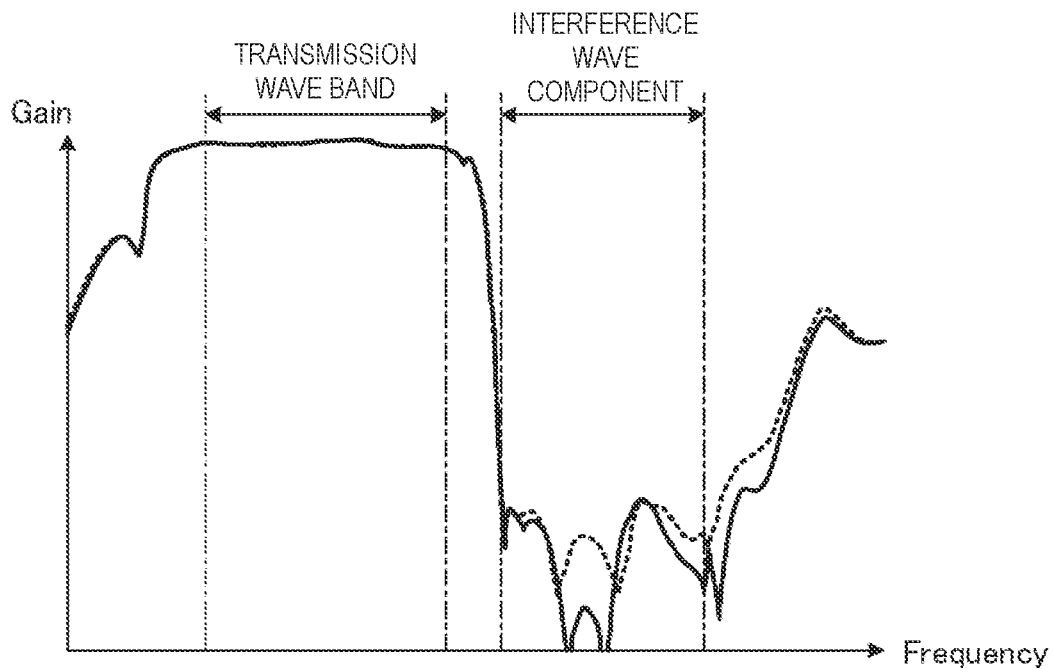
FIG. 19 is a graph illustrating a first example of a simulation result of attenuation performance between a transmission signal input terminal and an antenna terminal in the configuration illustrated in FIG. 18.
Figure 20:
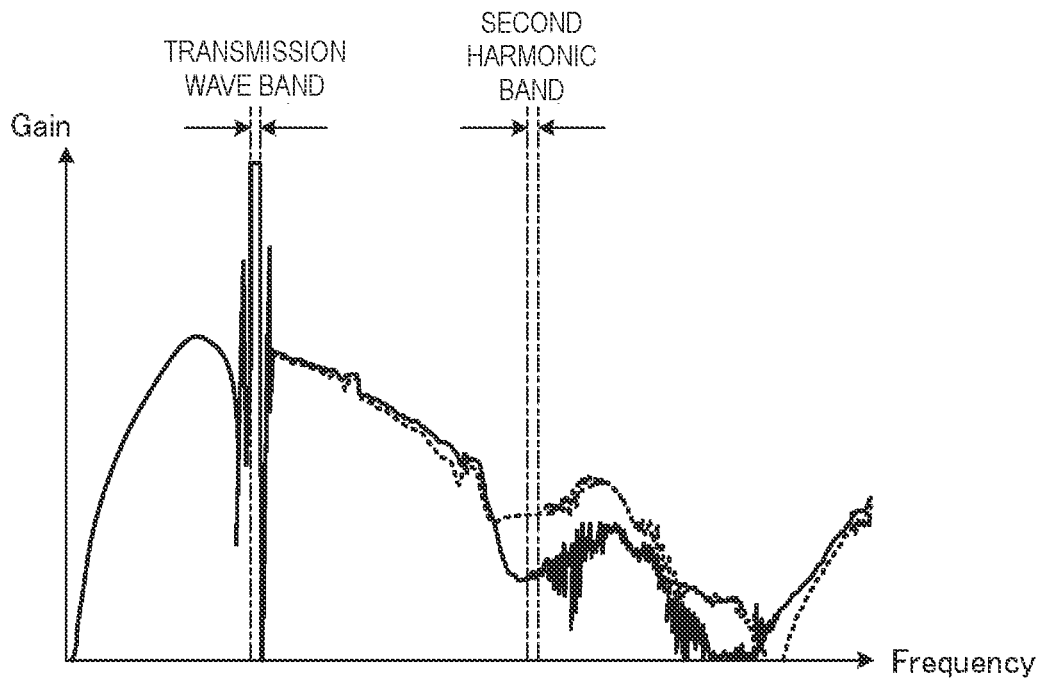
FIG. 20 is a graph illustrating a second example of a simulation result of the attenuation performance between the transmission signal input terminal and the antenna terminal in the configuration illustrated in FIG. 18.
Figure 21:
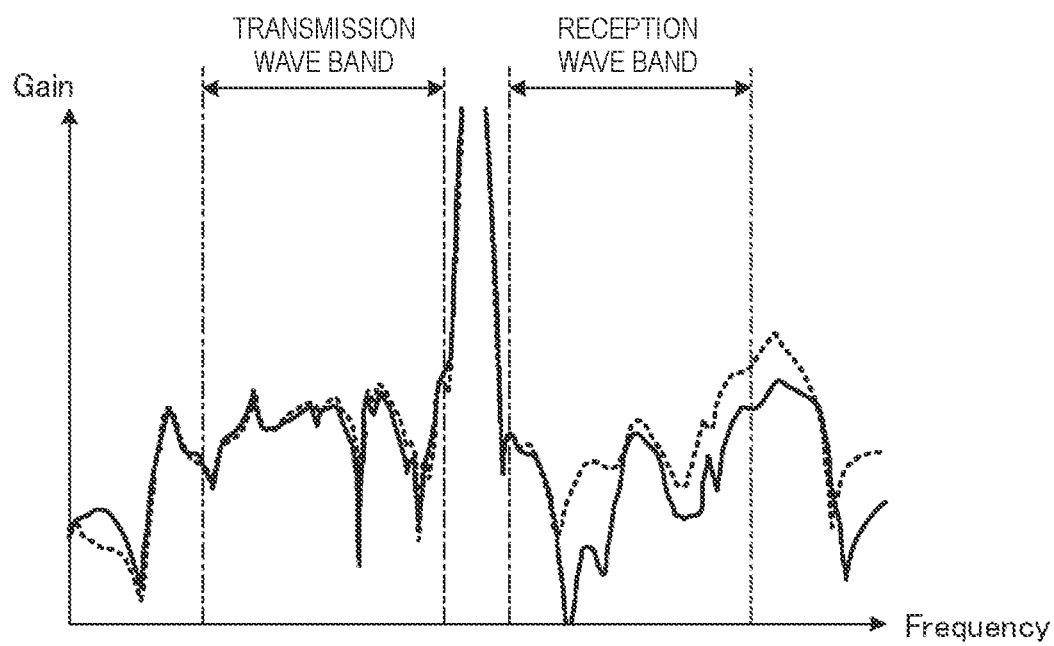
FIG. 21 is a graph illustrating a first example of a simulation result of isolation performance between the transmission signal input terminal and a reception signal output terminal in the configuration illustrated in FIG. 18.

FIG. 19 is a graph illustrating a first example of a simulation result of attenuation performance between the transmission signal input terminal and the antenna terminal in the configuration illustrated in FIG. 18. FIG. 20 is a graph illustrating a second example of a simulation result of attenuation performance between the transmission signal input terminal and the antenna terminal in the configuration illustrated in FIG. 18. FIG. 21 is a graph illustrating a first example of a simulation result of isolation performance between the transmission signal input terminal and the reception signal output terminal in the configuration illustrated in FIG. 18.

In FIG. 19 to FIG. 23, broken lines indicate simulation results when the winding axis directions of the inductors L1 and L2 illustrated in FIG. 18 are set to a direction parallel to the substrate 200 (specifically, for example, the X-axis direction) and the winding axis directions of the inductors L3 and L4 are set to a direction orthogonal to the substrate 200 (specifically, for example, the Z-axis direction), and solid lines indicate simulation results when the winding axis directions of the inductors L1, L2, L3, and L4 are set to the direction orthogonal to the substrate 200 (here, the Z-axis direction).

When the winding axis directions of the inductors L1, L2, L3, and L4 illustrated in FIG. 18 are set to the direction orthogonal to the substrate 200, mutual inductance components generated between the first inductor 10 and the other inductors (inductors L1, L2, L3, and L4) of the input/output filter circuit 1 and the third inductor 30 of the matching circuit 3 are suppressed as compared with a case where the winding axis directions of the inductors L1 and L2 are set to the direction parallel to the substrate 200. Thus, as illustrated in FIG. 19, an interference wave component (reception signal component) outer side portion of the transmission wave band is suppressed. As a result, it is possible to suppress deterioration in attenuation performance between the transmission signal input terminal TXin and the antenna terminal ANT. Further, as illustrated in FIG. 20, it is possible to enhance the effect of suppressing a second harmonic component of a transmission signal.

Further, as illustrated in FIG. 21, a transmission signal component superimposed on the second inductor 20 from the third inductor 30 is suppressed. As a result, it is possible to suppress deterioration in isolation performance between the transmission signal input terminal TXin and the reception signal output terminal RXout.

Figure 22:
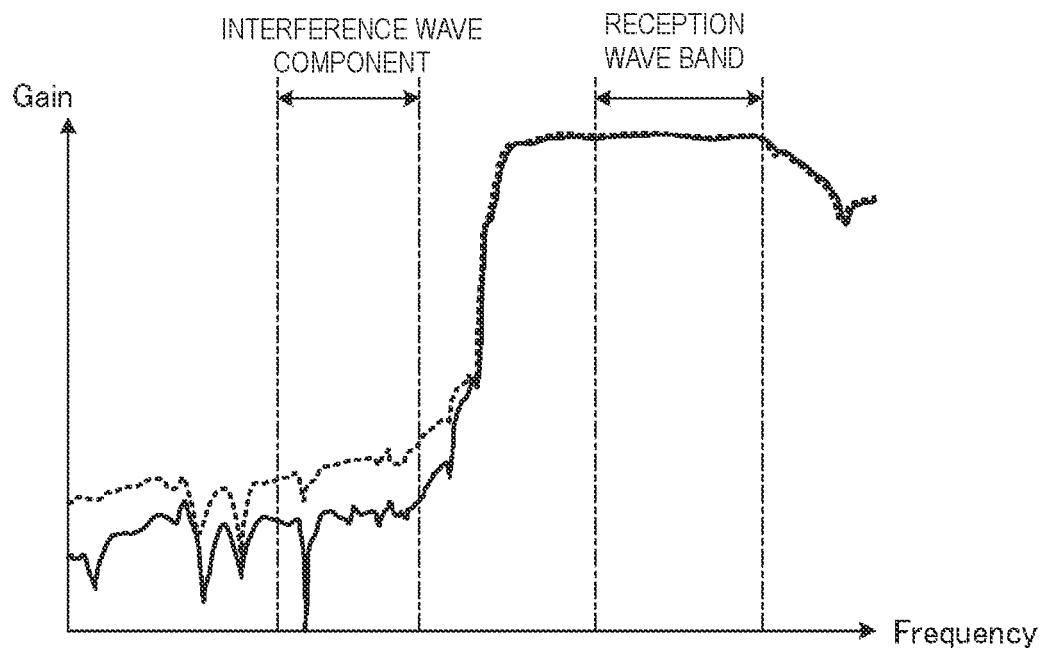
FIG. 22 is a graph illustrating an example of a simulation result of attenuation performance between the antenna terminal and the reception signal output terminal in the configuration illustrated in FIG. 18.
Figure 23:
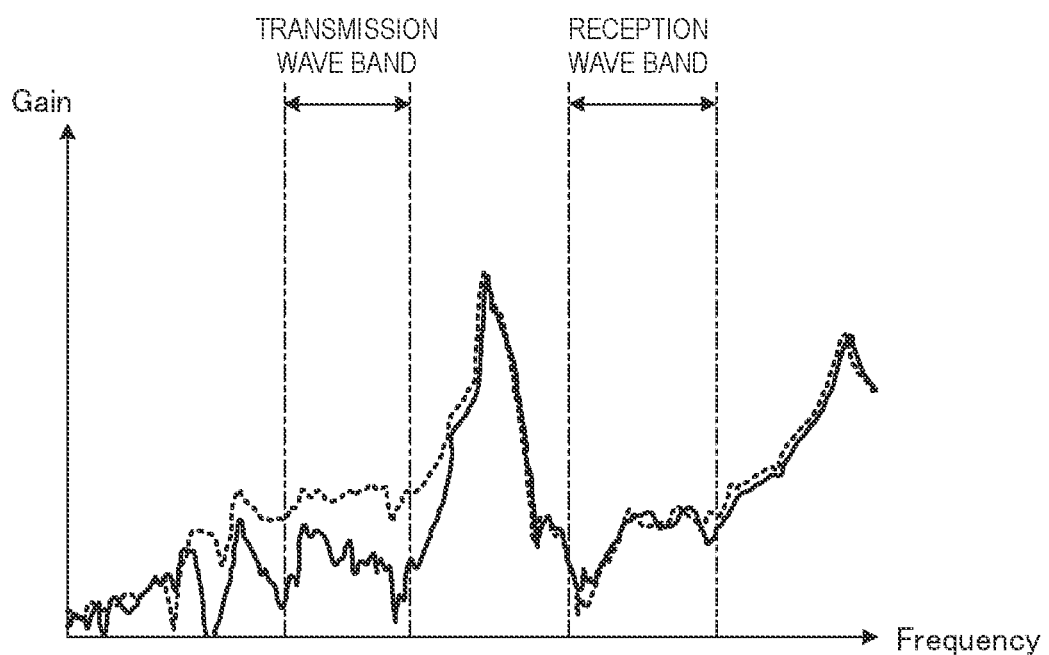
FIG. 23 is a graph illustrating a second example of a simulation result of the isolation performance between the transmission signal input terminal and the reception signal output terminal in the configuration illustrated in FIG. 18.

FIG. 22 is a graph illustrating an example of a simulation result of attenuation performance between the antenna terminal and the reception signal output terminal in the configuration illustrated in FIG. 18. FIG. 23 is a graph illustrating a second example of a simulation result of isolation performance between the transmission signal input terminal and the reception signal output terminal in the configuration illustrated in FIG. 18.

When the winding axis directions of the inductors L1, L2, L3, and L4 illustrated in FIG. 18 are set to the direction parallel to the substrate 200, mutual inductance components generated between the first inductor 10 and the other inductors (inductors L1, L2, L3, and L4) of the input/output filter circuit 1 and the second inductor 20 of the matching circuit 2 are suppressed as compared with the case where the winding axis directions of the inductors L1 and L2 are set to the direction orthogonal to the substrate 200. Thus, as illustrated in FIG. 22, an interference wave component (transmission signal component) outer side portion of the reception wave band is suppressed. As a result, it is possible to suppress deterioration in attenuation performance between the antenna terminal ANT and the reception signal output terminal RXout.

Further, as illustrated in FIG. 23, a transmission signal component superimposed on the second inductor 20 from the third inductor 30 is suppressed. As a result, it is possible to suppress deterioration in isolation performance between the transmission signal input terminal TXin and the reception signal output terminal RXout.

In addition, in the simulations of FIG. 19 to FIG. 23, the inductors L1 and L2 whose winding axis directions are changed are series inductors. In the series inductor that is positioned on the path through which a transmission signal and a reception signal pass between the antenna terminal ANT and the antenna switch circuit ANTSW, the intensity of a passing signal is likely to be large, and the influence of the magnetic coupling with the second inductor 20 and the third inductor 30 is likely to be increased, compared with the shunt inductor that is not positioned on the path. Thus, in the case where the input/output filter circuit 1 includes the series inductors (L1, L2, L4) and the shunt inductor (L3), by setting at least the winding axis directions of the series inductors to the Z-axis direction, it is possible to more easily suppress deterioration in isolation performance compared to a case where the winding axis of the shunt inductor is set to the Z-axis direction.

Furthermore, in the simulations of FIG. 19 to FIG. 23, for the inductors L1 and L2 whose winding axis directions are changed, the variable capacitor C1 is connected in parallel to the inductor L2, whereas other impedance elements (inductors, capacitors, and resistors) are not connected in parallel to the inductor L1. As described above, in the series inductor having no impedance element connected in parallel, the intensity of a signal passing through the series inductor is likely to be large, and the influence of the magnetic coupling with the second inductor 20 and the third inductor 30 is likely to be increased, compared to an inductor having an impedance element connected in parallel. Thus, by setting the winding axis of the inductor L1 that is a series inductor having no impedance element connected in parallel, to the Z-axis direction, it becomes easier to suppress deterioration in isolation performance. Note that the case of "having no impedance element connected in parallel" does not include a case where a parasitic impedance component is connected in parallel.

Embodiment 2

Figure 24:
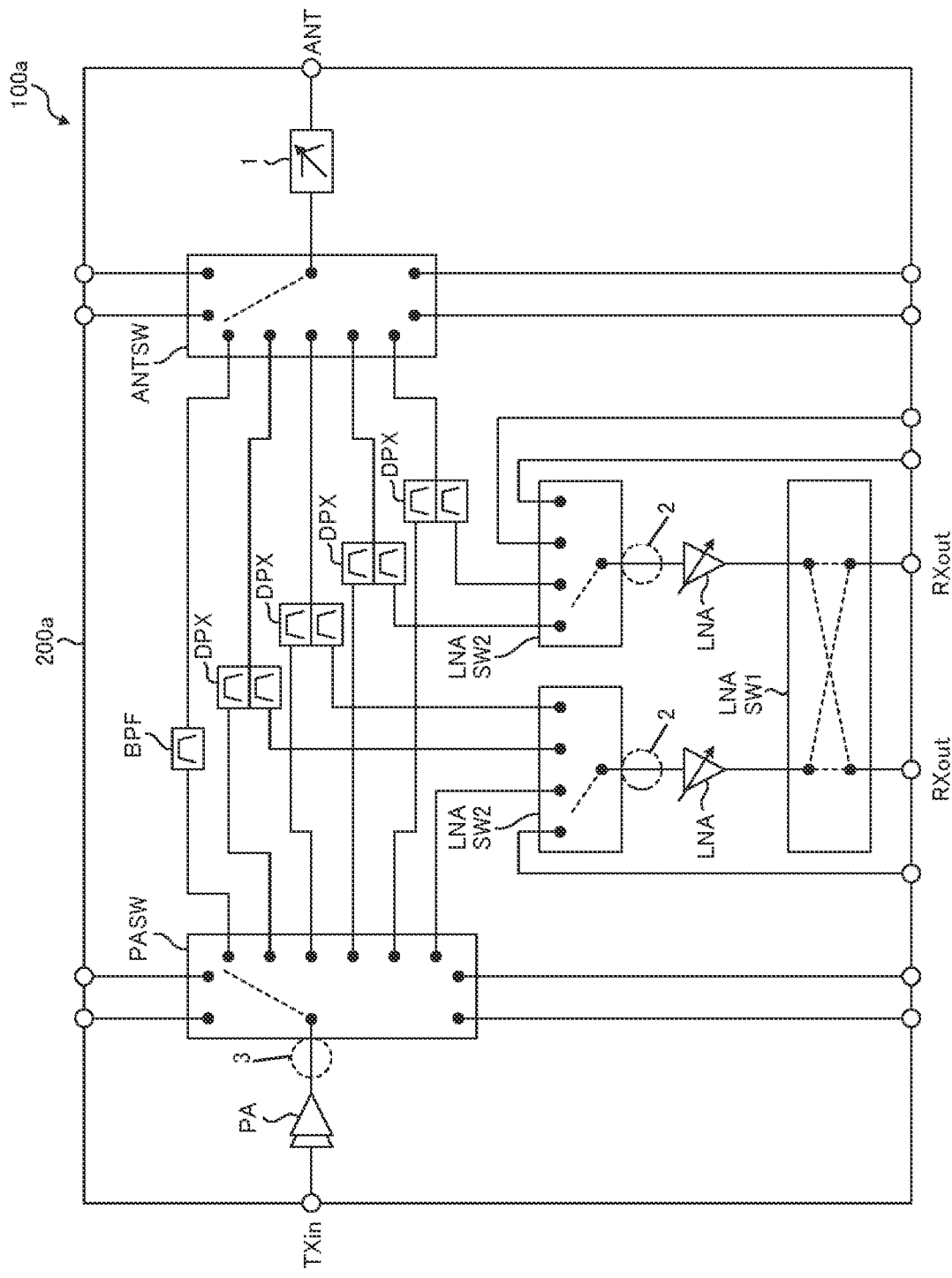
FIG. 24 is a schematic diagram illustrating a configuration example of a transmission/reception module according to Embodiment 2.

FIG. 24 is a schematic diagram illustrating a configuration example of a transmission/reception module according to Embodiment 2. In Embodiment 1 described above, the configuration for implementing carrier aggregation in the FDD scheme has been described, but a transmission/reception module 100a illustrated in FIG. 24 has a configuration for implementing a time division duplex (TDD) scheme.

Specifically, in the example illustrated in FIG. 24, one (or a plurality) of the duplexers DPX illustrated in FIG. 1 is configured as a band pass filter BPF. Even in such an aspect, by setting the winding axis direction of the first inductor 10 included in the input/output filter circuit 1 to a direction orthogonal to a substrate 200a, it is possible to suppress mutual inductance components generated between the inductors included in the respective matching circuits and the first inductor 10, and it is possible to effectively suppress deterioration in attenuation performance of a transmission signal or a reception signal or deterioration in isolation performance between a transmission signal and a reception signal, similar to Embodiment 1.

Embodiment 3

Figure 25:
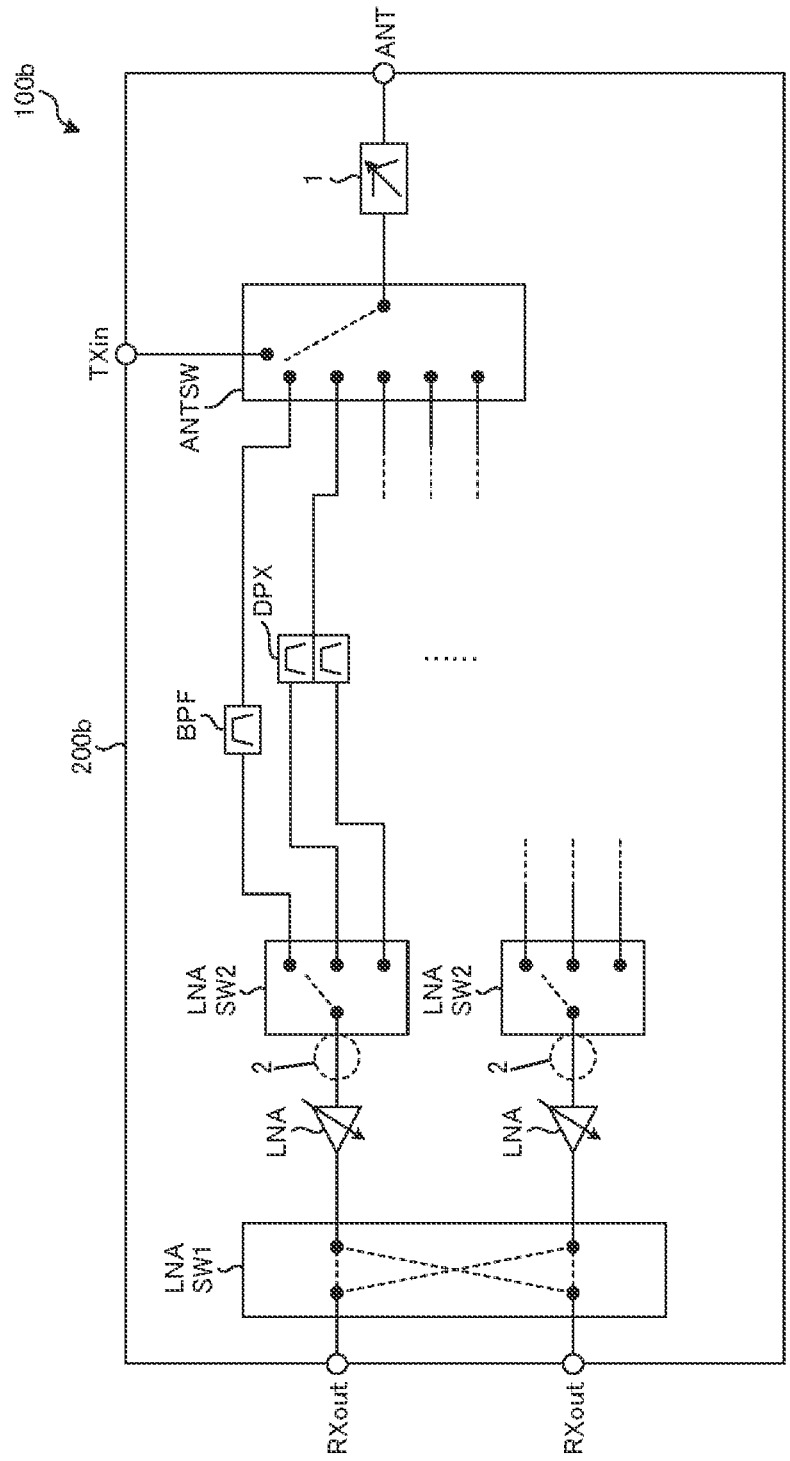
FIG. 25 is a schematic diagram illustrating a configuration example of a transmission/reception module according to Embodiment 3.

FIG. 25 is a schematic diagram illustrating a configuration example of a transmission/reception module according to Embodiment 3. A transmission/reception module 100b illustrated in FIG. 25 has a configuration in which a power amplifier circuit PA is not mounted on a substrate 200b, and a transmission signal is input from another module provided outside the transmission/reception module 100b, appropriately switched by the antenna switch circuit ANTSW, and output from the antenna terminal ANT with the input/output filter circuit 1 interposed therebetween. Even in such an aspect, by setting the winding axis direction of the first inductor 10 included in the input/output filter circuit 1 to a direction orthogonal to the substrate 200b, it is possible to suppress mutual inductance components generated between the inductors included in the respective matching circuits and the first inductor 10, and it is possible to effectively suppress deterioration in attenuation performance of a transmission signal or a reception signal or deterioration in isolation performance between a transmission signal and a reception signal, similar to Embodiment 1.

Note that the above-described embodiments are intended to facilitate understanding of the present disclosure, and are not intended to limit and construe the present disclosure. The present disclosure may be changed/improved without necessarily departing from the gist thereof, and equivalents thereof are also included in the present disclosure.

For example, the input/output filter circuit 1 may be configured not only as a low pass filter but also as any other filters, such as a band pass filter, a high pass filter, or a notch filter. In addition, in the embodiments described above, a configuration in which both the second inductor 20 and the third inductor 30 are provided has been described, but embodiments in the present disclosure are not limited thereto. For example, only the second inductor 20 (the second matching circuit 2) or only the third inductor 30 (the third matching circuit 3) may be provided in the transmission/reception module 100. Furthermore, a configuration is adoptable in which both the second inductor 20 (the second matching circuit 2) and the third inductor (the third matching circuit 3) are not provided in the transmission/reception module 100.

The present disclosure may employ the following configurations as described above or instead of the above description.

(1) A transmission/reception module according to an aspect of the present disclosure includes a substrate including a transmission signal input terminal, a reception signal output terminal, and an antenna terminal, an antenna switch circuit provided on the substrate and configured to output a transmission signal input from the transmission signal input terminal to the antenna terminal and configured to output a reception signal input from the antenna terminal to the reception signal output terminal, and a first inductor included in an input/output filter circuit provided between the antenna switch circuit and the antenna terminal, and the first inductor includes a conductor whose winding axis direction is orthogonal to the substrate.

(2) In the transmission/reception module according to (1) described above, the first inductor is a series inductor provided in series on a path connecting the antenna switch circuit and the antenna terminal.

(3) In the transmission/reception module according to (2) described above, another impedance element is not connected in parallel to the first inductor.

(4) In the transmission/reception module according to (1) described above, the input/output filter circuit includes a fourth inductor different from the first inductor, and the fourth inductor is a shunt inductor provided in series on a path connecting a path connecting the antenna switch circuit and the antenna terminal and a ground, and includes a conductor whose winding axis direction is orthogonal to the substrate.

(5) In the transmission/reception module according to (1) described above, the input/output filter circuit further includes another inductor or other inductors that are different from the first inductor, and each of the other inductors or all the other inductors includes a conductor whose winding axis direction is orthogonal to the substrate.

(6) The transmission/reception module according to any one of (1) to (5) described above further includes a second inductor included in a matching circuit provided between the antenna switch circuit and the reception signal output terminal.

(7) The transmission/reception module according to (6) described above further includes a low noise amplifier circuit provided on a path between the antenna switch circuit and the reception signal output terminal, and a low noise amplifier input switch circuit provided between the antenna switch circuit and the low noise amplifier circuit, and the second inductor is provided between the low noise amplifier circuit and the low noise amplifier input switch circuit.

(8) In the transmission/reception module according to (6) or (7) described above, the second inductor includes a conductor whose winding axis direction is parallel to the substrate.

(9) The transmission/reception module according to any one of (1) to (8) described above further includes a third inductor included in a matching circuit provided between the antenna switch circuit and the transmission signal input terminal.

(10) The transmission/reception module according to (9) described above further includes a power amplifier circuit provided on a path at a side of the transmission signal input terminal of the antenna switch circuit, and a power amplifier output switch circuit provided between the antenna switch circuit and the power amplifier circuit, and the third inductor is provided between the power amplifier circuit and the power amplifier output switch circuit.

(11) In the transmission/reception module according to (9) or (10) described above, the third inductor includes a conductor whose winding axis direction is parallel to the substrate.

(12) The transmission/reception module according to any one of (1) to (11) described above further includes a second inductor included in a matching circuit provided between the antenna switch circuit and the reception signal output terminal, and a third inductor included in a matching circuit provided between the antenna switch circuit and the transmission signal input terminal, and a winding axis direction of a conductor of the second inductor and a winding axis direction of a conductor of the third inductor are different from each other on the substrate.

(13) In the transmission/reception module according to any one of (1) to (12), the substrate is a multilayer substrate in which a plurality of wiring layers is laminated with an insulator layer interposed between the wiring layers, and a GND wiring overlapping the first inductor in a top view is not provided in the wiring layer adjacent in a lamination direction to the wiring layer to which the first inductor is connected.

(14) The transmission/reception module according to (13) described above further includes a second inductor included in a matching circuit provided between the antenna switch circuit and the reception signal output terminal, and a third inductor included in a matching circuit provided between the antenna switch circuit and the transmission signal input terminal, each of the second inductor and the third inductor includes an inductor including a conductor whose winding axis direction is orthogonal to the substrate, and in the substrate, the wiring layer adjacent in the lamination direction to the wiring layer connected with the inductor including the conductor whose winding axis direction is orthogonal to the substrate is not provided with a GND wiring overlapping the inductor in a top view.

(15) The transmission/reception module according to (13) or (14) described above further includes a shield case covering a component mounting surface of the substrate.

According to the present disclosure, it is possible to implement a transmission/reception module capable of suppressing deterioration in isolation characteristics and attenuation characteristics of a transmission/reception path.

What is claimed is:

1. A transmission/reception module comprising:
    a substrate comprising a transmission signal input terminal, a reception signal output terminal, and an antenna terminal;
    an antenna switch circuit on the substrate, the antenna switch circuit configured to output a transmission signal input from the transmission signal input terminal to the antenna terminal, and configured to output a reception signal input from the antenna terminal to the reception signal output terminal; and
    a first inductor connected between the antenna switch circuit and the antenna terminal, the first inductor being part of an input/output filter,
    wherein the first inductor comprises a conductor whose winding axis direction is orthogonal to the substrate.

2. The transmission/reception module according to claim 1, wherein the first inductor is a series inductor connected in series in a path connecting the antenna switch circuit to the antenna terminal.

3. The transmission/reception module according to claim 2, wherein another impedance circuit element is not connected in parallel to the first inductor.

4. The transmission/reception module according to claim 1,
    wherein the input/output filter circuit comprises a fourth inductor different from the first inductor, and
    wherein the fourth inductor is a shunt inductor connected in series in a shunt path connecting ground and a path connecting the antenna switch circuit to the antenna terminal, and comprises a conductor whose winding axis direction is orthogonal to the substrate.

5. The transmission/reception module according to claim 1,
    wherein the input/output filter circuit further comprises an additional inductor that is different from the first inductor, and
    wherein the additional inductor comprises a conductor whose winding axis direction is orthogonal to the substrate.

6. The transmission/reception module according to claim 1, further comprising:
    a second inductor connected between the antenna switch circuit and the reception signal output terminal, the second inductor being part of a matching circuit.

7. The transmission/reception module according to claim 6, further comprising:
    a low noise amplifier circuit connected in a path between the antenna switch circuit and the reception signal output terminal; and
    a low noise amplifier input switch circuit connected between the antenna switch circuit and the low noise amplifier circuit,
    wherein the second inductor is connected between the low noise amplifier circuit and the low noise amplifier input switch circuit.

8. The transmission/reception module according to claim 6, wherein the second inductor comprises a conductor whose winding axis direction is parallel to the substrate.

9. The transmission/reception module according to claim 1, further comprising:
    a third inductor connected between the antenna switch circuit and the transmission signal input terminal, the third inductor being part of a matching circuit.

10. The transmission/reception module according to claim 9, further comprising:
    a power amplifier circuit connected in a path between the antenna switch circuit and the transmission signal input terminal; and
    a power amplifier output switch circuit connected between the antenna switch circuit and the power amplifier circuit,
    wherein the third inductor is connected between the power amplifier circuit and the power amplifier output switch circuit.

11. The transmission/reception module according to claim 9, wherein the third inductor comprises a conductor whose winding axis direction is parallel to the substrate.

12. The transmission/reception module according to claim 1, further comprising:
    a second inductor connected between the antenna switch circuit and the reception signal output terminal; and
    a third inductor connected between the antenna switch circuit and the transmission signal input terminal, the second and third inductors being part of a matching circuit,
    wherein, on the substrate, a winding axis direction of a conductor of the second inductor and a winding axis direction of a conductor of the third inductor are different from each other.

13. The transmission/reception module according to claim 1,
    wherein the substrate is a multilayer substrate in which a plurality of wiring layers is laminated with an insulator layer interposed between the wiring layers, and a ground wiring overlapping the first inductor in a top view is not in the wiring layer adjacent in a lamination direction to the wiring layer to which the first inductor is connected.

14. The transmission/reception module according to claim 13, further comprising:
- a second inductor connected between the antenna switch circuit and the reception signal output terminal; and
- a third inductor connected between the antenna switch circuit and the transmission signal input terminal, the second and third inductors being part of a matching circuit,
- wherein each of the second inductor and the third inductor comprises a conductor whose winding axis direction is orthogonal to the substrate, and
- wherein in the substrate, the wiring layer adjacent in the lamination direction to the wiring layer connected with the second or third inductor does not have a ground wiring overlapping the second or third inductor in the top view.

15. The transmission/reception module according to claim 13, further comprising:
- a shield case covering a component mounting surface of the substrate.

* * * * *